US006967376B2

(12) United States Patent
Fox et al.

(10) Patent No.: US 6,967,376 B2
(45) Date of Patent: Nov. 22, 2005

(54) DIVOT REDUCTION IN SIMOX LAYERS

(75) Inventors: Stephen R. Fox, Hopewell Junction, NY (US); Neena Garg, Fishkill, NY (US); Kenneth J. Giewont, Hopewell Junction, NY (US); Junedong Lee, Hopewell Junction, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/832,215

(22) Filed: Apr. 26, 2004

(65) Prior Publication Data

US 2004/0197940 A1 Oct. 7, 2004

Related U.S. Application Data

(62) Division of application No. 09/884,670, filed on Jun. 19, 2001.

(51) Int. Cl.[7] .................. H01L 27/01; H01L 29/00; H01L 21/265; H01L 21/762; H01L 21/20
(52) U.S. Cl. ............... 257/347; 257/507; 257/E21.339; 257/E21.563; 438/480
(58) Field of Search .................. 257/617, 64, 347, 257/E21.563, 350, 507, E21.21, E21.339, 257/E27.112

(56) References Cited

U.S. PATENT DOCUMENTS

| | | |
|---|---|---|
| 4,749,660 A | 6/1988 | Short et al. |
| 4,786,608 A | 11/1988 | Griffith |
| 4,902,642 A | 2/1990 | Mao et al. |
| 4,975,126 A | 12/1990 | Margail et al. |
| 5,279,978 A | 1/1994 | See et al. |
| 5,288,650 A | 2/1994 | Sandow |
| 5,519,336 A | 5/1996 | Liu et al. |
| 5,589,407 A | 12/1996 | Meyyappan et al. |
| 5,930,643 A | 7/1999 | Sadana et al. |
| 6,043,166 A | 3/2000 | Roitman et al. |
| 6,090,689 A | 7/2000 | Sadana et al. |

FOREIGN PATENT DOCUMENTS

JP          63 217657         9/1988

OTHER PUBLICATIONS

Wolf, S., "Silicon Processing for the VLSI ERA", Vol. 2: Process Integration, 1990, pp. 72-73.
White, A.E., et al., "The role of Implant temperature in the formation of thin buried oxide layers", Beam-Solid Interactions and Transient Processes Symposium, Boston, MA, USA, Dec. 1-4, 1986, pp. 585-590, XP000922701.

Primary Examiner—Ha Nguyen
Assistant Examiner—Ron Pompey
(74) Attorney, Agent, or Firm—Scully, Scott, Murphy & Presser; Robert M. Trepp, Esq.

(57) ABSTRACT

A method of fabricating a silicon-on-insulator (SOI) having a superficial Si-containing layer that has a reduced number of tile and divot defects is provided. The method includes the steps of: implanting oxygen ions into a surface of a Si-containing substrate, the implanted oxygen ions having a concentration sufficient to form a buried oxide region during a subsequent annealing step; and annealing the substrate containing implanted oxygen ions under conditions wherein the implanted oxygen ions form a buried oxide region which electrically isolates a superficial Si-containing layer from a bottom Si-containing layer. Moreover, the annealing conditions employed are capable of reducing the number of tile or divot defects present in the superficial Si-containing layer so as to allow optical detection of any other defect that has a lower density than the tile or divot defect. The present invention also relates to the SOI substrate that is produced using the inventive method.

7 Claims, 4 Drawing Sheets

DIVOT REDUCTION IN SIMOX LAYERS

RELATED APPLICATION

This application is a divisional of U.S. application Ser. No. 09/884,670, filed Jun. 19, 2001.

CROSS-RELATED APPLICATIONS

This application is related to co-assigned U.S. application Ser. No. 09/861,593; co-assigned U.S. application Ser. No. 09/861,956; co-assigned U.S. application Ser. No. 09/861,594; and co-assigned U.S. application Ser. No. 09/861,590, the entire contents of each which were filed on May 21, 2001 are incorporated herein by reference.

FIELD OF THE INVENTION

The present invention relates to silicon-on-insulator (SOI) substrates for use in the semiconductor industry for fabricating integrated circuits (ICs), and more particularly to a separation by implantation of oxygen (SIMOX) process for substantially reducing the amount of tiles or divots that are formed in the superficial Si-containing layer that lies atop the buried oxide region of a SOI substrate.

BACKGROUND OF THE INVENTION

SIMOX is a technique that is employed in fabricating SOI substrates which can be used in the manufacturing of ICs. SIMOX typically involves using high-energy ions to implant a large dose of oxygen ions beneath the surface of a bulk Si wafer. Upon high-temperature annealing, the implanted oxygen forms a continuous buried oxide (BOX) region which electrically isolates the Si at the surface (i.e., the superficial Si layer). Typically, prior art SIMOX processes have been used to fabricate SOIs with a superficial Si layer and a BOX thickness of several thousand angstroms.

Conventional SIMOX processes include one of the following methods:

(i) a high-dose oxygen implantation (greater than about 4E17 $cm^{-2}$) step followed by annealing at temperatures of greater than about 1300° C. in an inert ambient such as Ar or $N_2$ that contains less than about 5% oxygen.

(ii) a high-dose oxygen implantation (greater than about 4E17 $cm^{-2}$) step followed by annealing at temperatures of greater than about 1300° C. in an inert ambient such as Ar or $N_2$ that contains a much higher content of oxygen than in method (i). Typically, the oxygen content used in the annealing step in this method is between 30–40% which is employed to promote internal thermal oxidation.

(iii) Combining base oxygen implant of greater than about 2E17 $cm^{-2}$ and room temperature implant (typically greater than about 1E15 $cm^{-2}$) followed by annealing in an inert ambient that contains oxygen in a concentration range of from about 8 to about 70%.

Figure 1A:
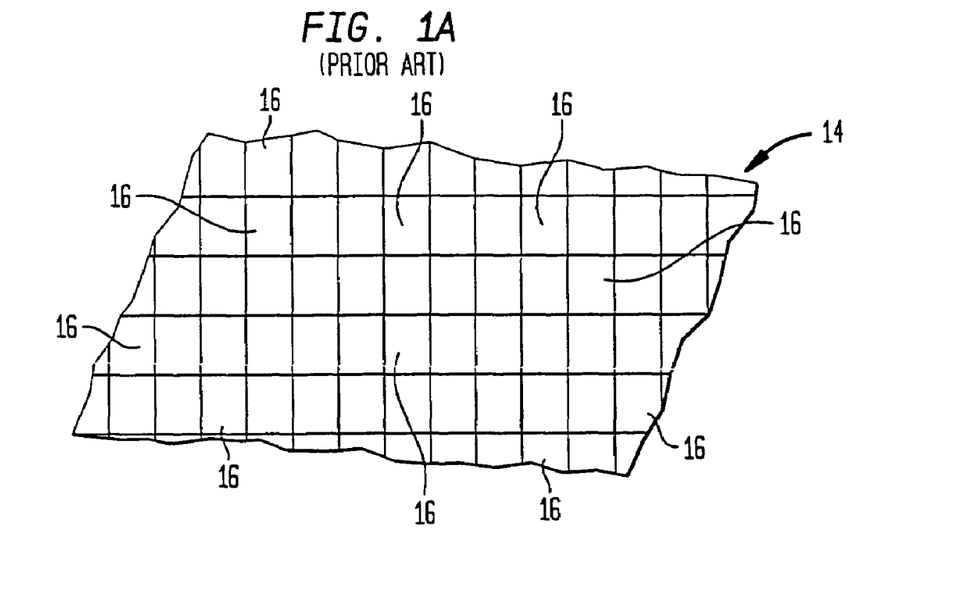
FIG. 1A is a top view showing the tile defects.

The conventional SIMOX processes mentioned above each suffer from the same problem in that the prior art SIMOX processes produce a superficial Si layer that contains tiles or divots. A pictorial representation of a prior art SOI substrate (top-down view) is shown, for example, in FIG. 1A. Specifically, FIG. 1A shows a portion of superficial Si layer 14 which lies atop a buried oxide region (BOX) that is not shown in this drawing. Note that in this drawing the superficial Si layer includes discrete tiles 16 across the entire surface of the superficial Si layer.

Figure 1B:
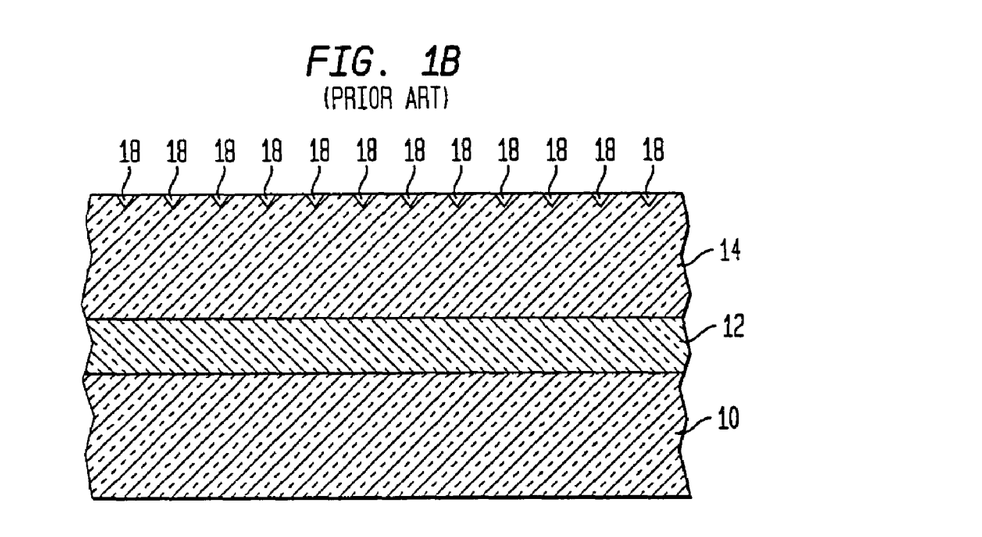
FIG. 1B is a cross-sectional view showing the divot defects.

FIG. 1B is a pictorial representation (through a cross-section) of a prior art SOI substrate. This substrate includes bottom Si layer 10, BOX region 12 and superficial Si layer 14. Note that in this drawing, divots 18 are shown in the surface of the superficial Si layer. Divots 18 are formed substantially at the point wherein the horizontal lines and the vertical lines shown in FIG. 1A intersect each other.

Typical optical inspection tools such as the KLA Tanker optical tool that operate with green to white light is inundated by the tile or divot features such that it is difficult to inspect other process induced features or defects which are much lower in density and can severely impact circuit yield.

To date, there are no satisfactory means for removing the tile or divot features that do not involve physically removing a portion of the superficial Si layer. Thus, there is a need for developing a new and improved SIMOX process in which the number of tile or divot features formed in the superficial Si layer is substantially reduced.

SUMMARY OF THE INVENTION

One object of the present invention is to provide a SIMOX process which substantially reduces the number of tile or divot features that are present in the superficial Si-containing layer of a SOI substrate.

Another object of the present invention is to provide a SIMOX process which provides a SOI substrate in which the superficial Si-containing layer has a substantially smooth, i.e., glass-like, surface.

A yet further object of the present invention is to provide a SIMOX process that does not include any extra processing steps which may be employed in substantially reducing the number of tile or divot features that are present in the superficial Si-containing layer of a SOI substrate (e.g., CMP).

An even further object of the present invention is to provide a SIMOX process in which the tile or divot features in the superficial Si-containing layer are substantially reduced so that conventional optical inspection tools can be used to detect very small defects (i.e., those defects that have a smaller density than the tiles or divots) that are typically undetectable because of the presence of the tile or divot features.

These and other objects and advantages are achieved in the present invention by utilizing the inventive method which includes the following processing steps:

(a) implanting oxygen ions into a surface of a Si-containing substrate, said implanted oxygen ions having a concentration sufficient to form a buried oxide region during a subsequent annealing step; and (b) annealing said Si-containing substrate containing said implanted oxygen ions under conditions wherein said implanted oxygen ions form said buried oxide region which electrically isolates a superficial Si-containing layer from a bottom Si-containing layer, said superficial Si-containing layer having a top surface which contains a reduced number of tile or divot defects so as to allow optical detection of any other defect that has a lower density than the tile or divot defect.

It should be emphasized that the term "Si-containing substrate" is used herein to denote substrates that comprise Si, SiGe, Si/Si, Si/SiGe, Si/SiC or preformed SOI substrates which may include single or multiple BOX layers in blanket or patterned forms.

In accordance with a first embodiment of the present invention, tile and divot defects are reduced by utilizing an annealing step wherein the ambient gas used during annealing contains from about 0 to about 90% oxygen and from about 10 to about 100% of at least one high-surface mobility gas that hinders oxide growth, said high-mobility gas is selected from He, $N_2$, Kr, $H_2$ and mixtures thereof. Of these high-surface mobility gases, $N_2$ is preferred in the present invention, and it is even more highly preferred to use 100% $N_2$ during the annealing step. Note that when a high content of $N_2$ is employed (1% or greater), a buried oxide (BOX) region having an undulating defect-containing interface is formed. Note that the present invention contemplates the use of a mixture of high-mobility gas and Ar during the single annealing step mentioned above.

In a second embodiment of the present invention, tile and divot defects are substantially reduced by utilizing a two-step anneal which includes the steps of: partially annealing the Si-containing substrate containing the implanted oxygen ions in oxygen so as to form a surface layer of oxide on the Si-containing substrate and to partially form said BOX region; stripping the surface layer of oxide; and continuing the annealing to complete formation of said BOX region.

In the two step annealing process mentioned above, a gas mixture including, for example, $N_2$ and Ar may be employed in both anneal steps, or alternatively, different gases, for example, $N_2$ for the partial annealing step and Ar for the second anneal, or vice versa, may be employed.

Another aspect of the present invention relates to a SOI substrate that is formed utilizing the inventive method. Specifically, the inventive SOI substrate comprises:

a buried oxide region that is sandwiched between a superficial Si-containing layer and a bottom Si layer, said superficial Si-containing layer having a top surface which contains a reduced number of tile or divot defects so as to allow optical detection of any other defect that has a lower density than the tile or divot defect.

In one embodiment of the present invention, the SOI substrate includes a BOX region which has a uniform interface with said superficial Si-containing layer. In another embodiment of the present invention, the SOI substrate includes a BOX region that has an undulating defect-containing interface with said superficial Si-containing layer. In yet another embodiment, the top surface of the superficial Si-containing layer is smooth and has a glass-like appearance. In some embodiments of the present invention, the BOX region is present continuously through the substrate, while in other embodiments, discrete and isolated BOX regions are present in the substrate.

BRIEF DESCRIPTION OF THE DRAWINGS

FIGS. 1A–1B are pictorial representations of a prior art SOI substrate which includes tile and divot defects in the superficial Si layer.

FIGS. 2A–B are pictorial representations of the inventive SOI substrate in which the superficial Si-containing layer has a reduced number of tile and divot defects.

DETAILED DESCRIPTION OF THE INVENTION

The present invention which provides a method of substantially reducing the number of tile or divot defects present on the surface of a SOI substrate will now be described in more detail by referring to the drawings that accompany the present application. It is noted that in the accompanying drawings, like and/or corresponding elements are referred to by like reference numerals.

Figure 2A:
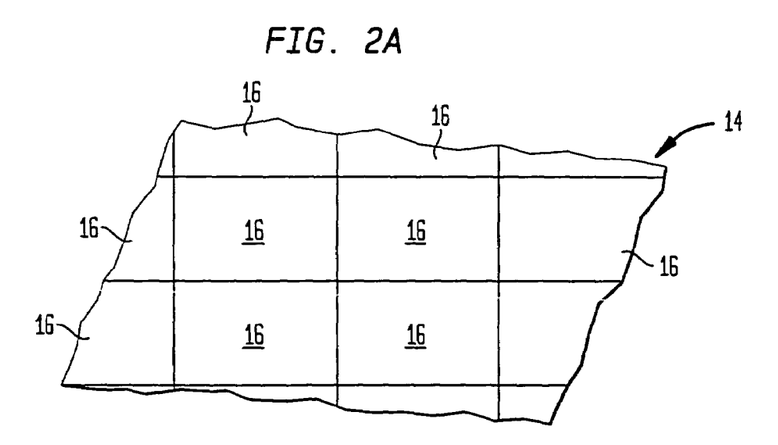
FIG. 2A is a top view showing reduced tile defects.
Figure 2B:
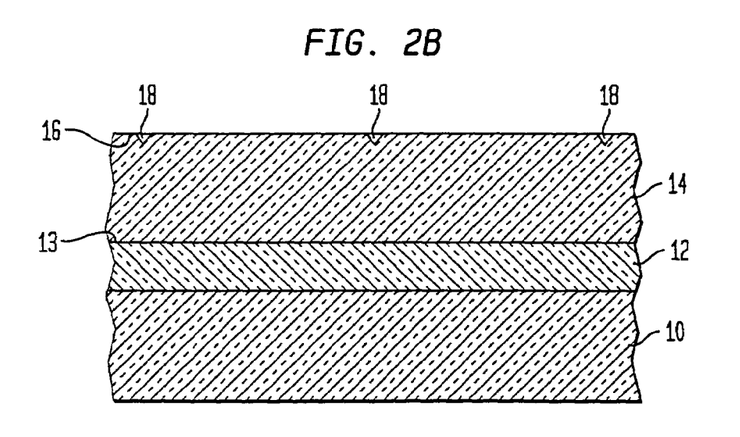
FIG. 2B is a cross-sectional view showing reduced divot defects.

Reference is first made to FIGS. 2A–B which are pictorial representations of the inventive SOI wafer. Specifically, FIG. 2A is a top-down view of the inventive SOI substrate showing superficial Si-containing layer 14 that overlays a BOX region which is not shown in this view. Note that the superficial Si-containing layer contains fewer tiles 16 and that the tiles are much larger than in the case of the prior art tiles shown in FIG. 1A. Because of these two factors, a conventional optical inspection tool can detect other processing features and/or defects that are difficult to detect on prior art SOI substrates.

FIG. 2B shows a cross-sectional view of the inventive SOI substrate. As is shown, the inventive SOI substrate includes buried oxide region 12 that is sandwiched between superficial Si-containing layer 14 and bottom Si-containing layer 10. In accordance with the present invention, superficial Si-containing layer 14 has a top surface 16 which contains a reduced number of divot defects 18 so as to allow optical detection of any other defect that has a lower density than the divot defects. Note that the tile defects are not shown in this view and that the number of divot defects is significantly less than shown in FIG. 1B.

The thickness of the BOX regions formed in the present invention may vary depending upon the exact embodiment used in fabricating the same. Typically, however, the BOX region of the present invention has a thickness of from about 500 to about 10,000 Å, with a thickness of from about 1000 to about 2000 Å being more highly preferred. It is noted that the thickness reported herein is a mean range which is based on a Gaussian distribution curve.

Insofar as the top superficial Si-containing layer is concerned, that Si-containing layer may have a variable thickness which is also dependent upon the exact embodiment used in fabricating the same. Typically, however, the superficial Si-containing layer of the SOI substrate of the present invention has a thickness of from about 100 to about 10,000 Å, with a thickness of from about 100 to about 2000 Å being more highly preferred. The thickness of the bottom Si-containing layer is inconsequential to the present invention.

In some instances, the top surface of the superficial Si-containing layer contains no tile or divot defects therein. In that circumstance, the SOI wafer includes a superficial Si-containing layer having a smooth top surface which has a glass-like appearance. This embodiment of the present invention is shown, for example, in FIGS. 3 and 4.

In one embodiment of the present invention, the SOI substrate includes a BOX region which has a uniform interface with said superficial Si-containing layer. This embodiment of the present invention is depicted in FIG. 2B wherein reference numeral 13 denotes the interface between BOX region 12 and superficial Si-containing layer 14.

Figure 3:
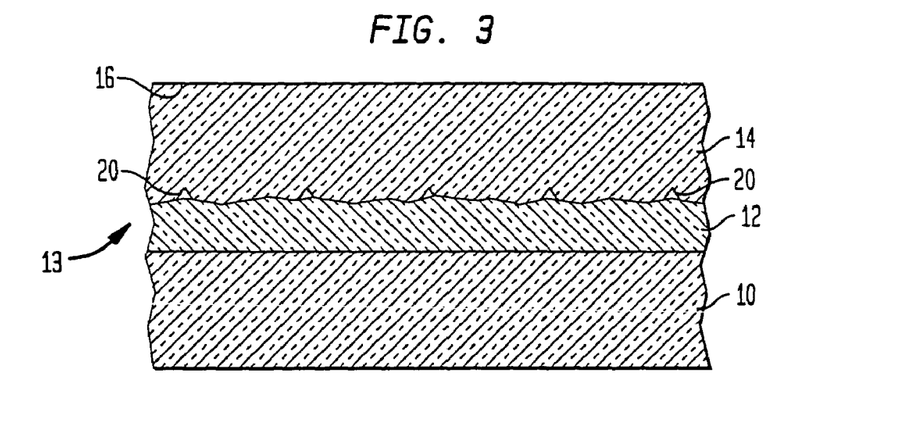
FIG. 3 is a pictorial representation of the inventive SOI substrate (cross-sectional view) in which the BOX region has an undulating defect-containing interface with said superficial Si-containing layer.

In another embodiment of the present invention, the SOI substrate includes a BOX region that has an undulating defect-containing interface with said superficial Si-containing layer. This embodiment of the present invention is depicted in FIG. 3 wherein reference numeral 13 is again used to denote the interface between BOX region 12 and superficial Si-containing layer 14 and reference numeral 20 denotes the undulating defects that are present in the interface. It is noted that the SOI substrate illustrated in FIG. 3 may be especially useful as an optical semiconductor device since the undulating defects can be used to scatter light that is being transmitted into the substrate via top surface 16.

Figure 4:
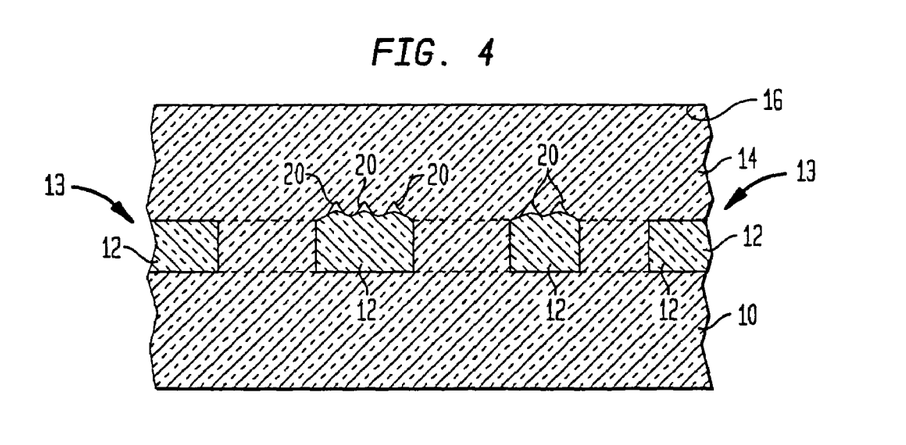
FIG. 4 is a pictorial representation of the inventive SOI substrate (cross-sectional view) in which discrete and isolated BOX regions are present in the Si substrate; note that some of the BOX regions include an undulating defect-containing interface.

In some embodiments of the present invention, the BOX region is present continuously through the Si substrate. This is shown, for example, in FIGS. 2B and 3, while in other embodiments, discrete and isolated BOX regions are present in the Si substrate in single or multiple layers. The later embodiment of the present invention is depicted in FIG. 4. Note that in this drawing some of the discrete and isolated BOX regions contain an interface that is uniform with the superficial Si-containing layer and other discrete and isolated BOX regions contain an undulating defect-containing interface between the BOX region and the superficial Si-containing layer.

The inventive SOI wafers shown in FIGS. 2–4 can be used in forming high-performance semiconductor devices or circuits. Examples of such devices or circuits that can contain the inventive SOI substrate include, but are not limited to: microprocessors, memory cells such as dynamic random access memory (DRAM) or static random access memory (SRAM), application specific integrated circuits (ASICs) and larger and more complicated structures. Since these devices or circuits are well known to those skilled in the art, it is not necessary to provide a detail description concerning the same. It is, however, emphasized that the active devices and/or circuits are typically formed in the top superficial Si-containing layer, i.e., layer 14.

The method used in forming the inventive SOI substrate which contains a reduced number of tile or divot defects will now be described in greater detail. Broadly speaking, the inventive method includes the steps of: implanting oxygen ions into a surface of a Si-containing, said implanted oxygen ions having a concentration sufficient to form a buried oxide region during a subsequent annealing step; and annealing said Si-containing substrate containing said implanted oxygen ions under conditions wherein said implanted oxygen ions form said buried oxide region which electrically isolates a superficial Si-containing layer from a bottom Si-containing layer, said superficial Si-containing layer having a top surface which contains a reduced number of tile or divot defects so as to allow optical detection of any other defect that has a lower density than the tile or divot defect.

It should be noted that the inventive method works using conventional SIMOX implants that are well known to those skilled in the art. Thus, for example, the ion implantation conditions described in co-assigned U.S. Pat. No. 5,930,643 to Sadana, et al.; U.S. Pat. No. 6,043,166 to Roitman, et al.; and U.S. Pat. No. 6,090,689 to Sadana, et al., the entire contents of each of which is incorporated herein by reference, may be employed in the present invention.

Figure 5A:
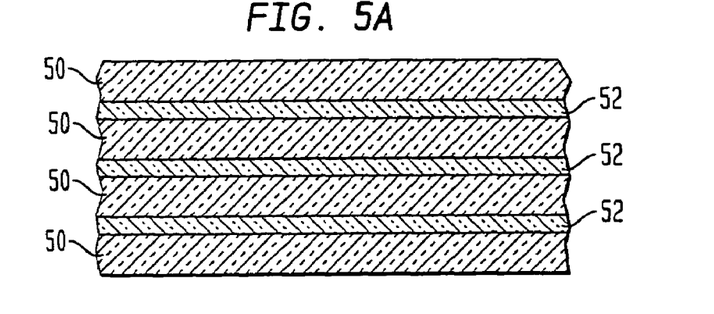
FIGS. 5A–C are pictorial representations of some types of preformed SOI substrates that can be employed in the present invention.
Figure 5B:
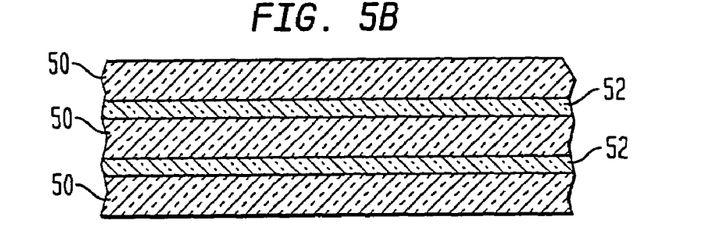
Figure 5C:
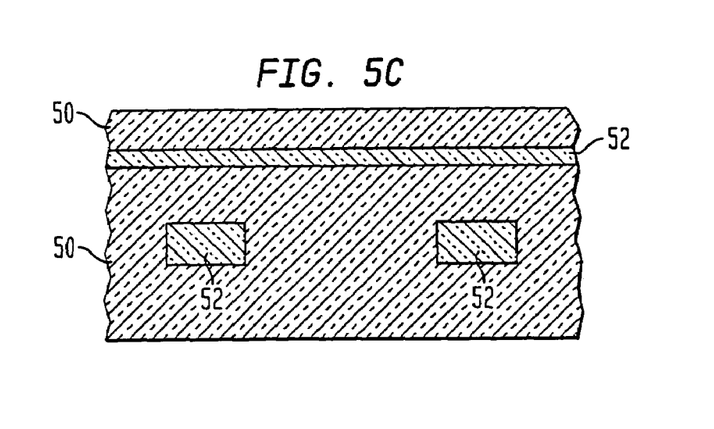

It is further noted that the Si-containing substrate used in forming the SOI substrate may be undoped or doped (p or n-type) depending on its future use. This wafer may be a SOI wafer with a single or multiple BOX layers with or without any patterns or, the wafer may be any of the previously mentioned Si-containing substrates. Reference is made to FIGS. 5A–C which show some examples of possible preformed SOI substrates, that can be employed herein. In each of these drawings, reference numeral 50 denotes a Si-containing layer and reference numeral 52 is the BOX layer.

Although conventional ion implants can be employed in the present invention, the following description provides some more details of the different types of oxygen ion implantation steps that may be employed in the present invention.

I. High-dose oxygen ion implantation: The term "high-dose" as used herein denotes an oxygen ion dosage of about 4E17 cm$^{-2}$ or greater, with an oxygen ion dosage of from about 4E17 to about 2E18 cm$^{-2}$ being more preferred. In addition to using high-oxygen dosage, this implant is typically carried out in an ion implantation apparatus that operates at a beam current of from about 0.05 to about 500 milliamps cm$^{-2}$ and at an energy of from about 10 to about 1000 keV. More preferably, this implant is carried out using an energy of from about 120 to about 210 keV.

This implant, which may be referred to as a base ion implant, is carried out at a temperature of from about 200° to about 800° C. at a beam current density of from about 0.05 to about 500 mA cm$^{-2}$. More preferably, the base ion implant may be carried out at a temperature of from about 200° to about 600° C. at a beam current density of from about 4 to about 8 mA cm$^{-2}$.

If desired, the base oxygen implant step may be followed by a second oxygen implant that is carried out using an oxygen dose of from about 1E14 to about 1E16 cm$^{-2}$, with an oxygen dose of from about 1E15 to about 4E15 cm$^{-2}$ being more highly preferred. The second oxygen implant is carried out at an energy of from about 40 keV or greater, with an energy of from about 120 to about 450 keV being more preferred.

This second implant is performed at a temperature of from about 4K to about 200° C. with a current density of from about 0.05 to about 10 mA cm$^{-2}$. More preferably, the second oxygen implant may be performed at a temperature of from about 25° to about 100° C. with a beam current density of from about 0.5 to about 5.0 mA cm$^{-2}$.

Note that the second oxygen implant forms an amorphous region below the damaged region caused by the base ion implant step. During the subsequent annealing, the amorphous and damaged region are converted into a BOX region.

II. High-energy, high-dose oxygen implant: The term "high-dose" as used herein denotes an oxygen ion dose of about 4E17 cm$^{-2}$ or greater, wash an oxygen ion dose of from about 5E17 to about 7E17 cm$^{-2}$ being more preferred. The term "high-energy", on the other hand, denotes an energy from about 60 keV or greater, with an implant energy of from about 200 to about 500 keV being more highly preferred.

This implant, which may be referred to as a base ion implant, is carried out at a temperature of from about 100° to about 800° C. with a beam current density of from about 0.05 to about 500 mA cm$^{-2}$. More preferably, the base ion implant may be carried out at a temperature of from about 300° to about 700° C. with a beam current density of from about 0.05 to about 500 mA cm$^{-2}$. If desired, the base oxygen implant step may be followed by a second oxygen implant that is carried out as mentioned hereinabove.

III. Low-dose oxygen implant: The term "low-dose" as used herein for this embodiment of the present invention denotes an oxygen ion dose of about 4E17 cm$^{-2}$ or less, with an oxygen ion dose of from about 1E17 to about 3.9E17 cm$^{-2}$ being more preferred. This low-dose implant is performed at an energy of from about 20 to about 10000 keV, with an implant energy of from about 100 to about 210 keV being more highly preferred.

This implant, which may be referred to as a base ion implant, is carried out at a temperature of from about 100° to about 800° C. More preferably, the base ion implant may be carried out at a temperature of from about 200° to about 650° C. with a beam current density of from about 0.05 to about 500 mA cm$^{-2}$.

If desired, the base oxygen implant step may be followed by a second oxygen implant that is carried out using the conditions mentioned above.

It is again emphasized that the above types of oxygen ion implantations are exemplary and by no way limit the scope of the present invention. Instead, the present invention contemplates all conventional oxygen ion implants that are typical employed in conventional SIMOX processes.

Following the implanting of oxygen ions into the surface of the Si-containing substrate, the substrate containing implanted oxygen ions is then subjected to an annealing step which is performed under conditions wherein said implanted oxygen ions form a buried oxide region which electrically isolates a superficial Si-containing layer from a bottom Si-containing layer. Moreover, the annealing is unlike prior art SIMOX annealing steps in that the anneal conditions reduce the number of tile or divot defects present in the superficial Si-containing layer so as to allow optical detection of any other defect that has a lower density than the tile or divot defect.

In accordance with a first embodiment of the present invention, tile and divot defects are reduced by utilizing an annealing step wherein the ambient gas used during annealing contains from about 0 to about 90% oxygen and from about 10 to about 100% of at least one high-surface mobility gas that hinders oxide growth. More preferably, the annealing step of the first embodiment of the present invention is carried out in an ambient gas the comprises from about 0 to about 50% oxygen and from about 50 to about 100% of at least one high-surface mobility gas.

Illustrative examples of high-surface mobility gases that can be employed in the present invention include, but are not limited to: He, N$_2$, Kr, H$_2$ and mixtures thereof such as He—N$_2$. Note Ar (alone) is not mentioned since annealing in an oxygen/Ar ambient causes tile and divot defects to form. Argon could, however, be used with one of the above mentioned high-surface mobility gases provided that it be used amounts that are the same or less than the high-surface mobility gases. Thus, when Ar is employed, it must be used with one of the above-mentioned high-surface mobility gases, in amounts of about 50% or less. Of these high-surface mobility gases, N$_2$ is preferred and it is even more highly preferred to use 100% N$_2$ during the annealing step. Note that when a high content of N$_2$ is employed (1% or greater), a buried oxide (BOX) region having an undulating defect-containing interface (See FIG. 3) is formed.

Notwithstanding the type of ambient gas employed in this embodiment of the present invention, annealing is typically performed at a temperature of about 1250° C. or above for a time period of from about 1 to about 100 hours. More preferably, annealing is performed at a temperature of from about 1300° to about 1350° C. for a time period of from about 2 to about 24 hours.

The annealing step may be carried out by simply heating the wafer at a specific ramp temperature to the targeted temperature, or various ramp and soak cycles may be employed. During the various ramp and soak cycles it is possible to vary the content of the annealing ambient within the ranges mentioned above. Also, it is possible to change the annealing ambient gas mixture during the various ramp and soak cycles. The parameters for the ramp and soak cycles are clearly mentioned in previously incorporated U.S. Pat. No. 5,930,643 to Sadana, et al; therefore, it is not necessary to repeat the parameters herein. Note that the parameters for the ramp and soak cycles in the '643 patent may be adjusted herein to achieved formation of the inventive SOI substrate. For example, the ramp rate (heating and/or cooling) may be adjusted to be within the range of from about 0.1° C./min to about 10° C./min.

In a second embodiment of the present invention, tile and divot defects are substantially reduced by utilizing a two-step anneal which includes the steps of: partially annealing the Si-containing substrate containing the implanted oxygen ions in oxygen so as to form a surface layer of oxygen on the substrate and to partially form said BOX region; stripping the surface layer of oxygen; and continuing the annealing to complete formation of said BOX region.

Specifically, in the second embodiment of the present invention, partially annealing is carried out in an ambient that includes from about 1 to about 100% oxygen and from about 0 to about 99% inert gas such as He, Ar, Kr, N$_2$ and mixtures thereof In one preferred embodiment of the present invention, N$_2$ or a mixture of N$_2$ and Ar is employed as the inert gas. When greater than 50% oxygen is employed, the annealing step may be referred to as an oxidation step. More preferably, the annealing step employed in this embodiment of the present invention is carried out in an ambient that includes from about 5 to about 20% oxygen and from about 80 to about 95% inert gas. In an even more preferable embodiment of the present invention, 100% oxygen is employed. The later embodiment is only possible when a Si-containing layer is formed atop the structure prior to annealing.

This partial annealing is typically performed at a temperature of from about 1250° to about 1400° C. for a time period of from about 1 to about 100 hours. More preferably, annealing is performed at a temperature of from about 1320° to about 1350° C. for a time period of from about 2 to about 20 hours. The partial annealing step may be carried out by simply heating the wafer at a specific ramp temperature to the targeted temperature, or various ramp and soak cycles may be employed. During the various ramp and soak cycles it is possible to vary the content of the annealing ambient within the ranges mentioned above and/or switch gases. The parameters for the ramp and soak cycles for the partial annealing may be the same as mentioned in previously incorporated U.S. Pat. No. 5,930,643 to Sadana, et al. Note that the parameters for the ramp and soak cycles in the '643 patent may be adjusted herein to achieved formation of the inventive SOI substrate.

During the partially annealing step, an oxide (on the order of about 6000 Å) is formed on the surface of the wafer. Also, since the partial anneal may include conventional annealing conditions, tiles and divots may form in the Si-containing surface. The oxide that is formed from the partial annealing step is then removed utilizing a conventional wet etch process that includes an etchant that has a high-selectivity for removing oxide as compared to Si.

Following the removal of the oxide layer, the wafer containing the partially formed BOX region is then annealed a second time using the ambient gas used in the first embodiment described above or modifying it by mixing with other inert gases such as Ar. This second anneal which completes the formation of the BOX region is typically performed at a temperature of from about 1250° to about 1400° C. for a time period of from about 1 to about 100 hours. More preferably, this second anneal is performed at a temperature of from about 1320° to about 1350° C. for a time period of from about 2 to about 20 hours. Like the partial anneal, the second partial annealing step may be carried out by simply heating the wafer at a specific ramp temperature to the targeted temperature, or various ramp and soak cycles may be employed. During the various ramp and soak cycles it is possible to vary the content of the annealing ambient within the ranges mentioned above and/or switch gases. The parameters for the ramp and soak cycles for the second annealing may be the same as mentioned in previously incorporated U.S. Pat. No. 5,930,643 to Sadana, et al. Note that the parameters for the ramp and soak cycles in the '643 patent may be adjusted herein to achieved formation of the inventive SOI substrate.

Notwithstanding which embodiment is employed in the present invention, it is possible to apply a patterned dielectric mask to the surface of the bulk SOI wafer prior to oxygen implantation. The application of a patterned dielectric mask to the surface of the SOI substrate allows for the formation of a SOI substrate which has discrete and isolated BOX regions having the properties mentioned above, i.e., reduced number of tile and divot defects in the superficial Si-containing layer. Such a SOI substrate is shown, for example, in FIG. 4, wherein the denoted reference numerals have the same meaning as mentioned above.

The structure shown in FIG. 4 is obtained by providing a conventional dielectric material to the surface of the substrate, patterning the dielectric material using conventional lithography including the steps of: applying a resist to the dielectric material, exposing the resist to a pattern of radiation, developing the exposed resist, transferring the pattern to the dielectric material via an etching process and removing the exposed resist from the structure. After these steps, the structure including the patterned dielectric mask blocking portions of the substrate is subjected to one of the embodiments mentioned above, i.e., single annealing step or two-step annealing.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail what we claim as new and desire to secure by the Letters Patent is:

1. A silicon-on-insulator (SOI) substrate comprising:
a buried oxide region having a thickness from about 1000 to about 2000 Å that is sandwiched between a superficial Si-containing layer having a thickness from about 100 to about 2000 Å and a bottom Si-containing layer, said superficial Si-containing layer having an upper surface including a number of tile defects or divot defects having a first density that does not obstruct detection of other defects that have a second density that is lower than the first density.

2. The SOI substrate of claim 1 wherein said buried oxide region has a uniform interface with said superficial Si-containing layer.

3. The SOI substrate of claim 1 wherein said buried oxide region has an undulating defect-containing interface with said superficial Si-containing layer.

4. The SOI substrate of claim 1 wherein said superficial Si-containing layer is smooth and has a glass-like appearance.

5. The SOI substrate of claim 1 wherein said buried oxide region is present continuously through the substrate.

6. The SOI substrate of claim 1 wherein said substrate comprises discrete and isolated buried oxide regions.

7. The SOI substrate of claim 6 wherein some of said discrete and isolated buried oxide regions have an undulating defect-containing interface with said superficial Si-containing layer.

* * * * *

UNITED STATES PATENT AND TRADEMARK OFFICE
CERTIFICATE OF CORRECTION

PATENT NO. : 6,967,376 B2 Page 1 of 1
APPLICATION NO. : 10/832215
DATED : November 22, 2005
INVENTOR(S) : Stephen R. Fox et al.

It is certified that error appears in the above-identified patent and that said Letters Patent is hereby corrected as shown below:

Title Page: [75]
Missing Inventors:

Maurice H. Norcott, San Jose, CA
Siegfried L. Maurer, Stromville, NY

Column 6, Line 48:
"or greater, wash an oxygen" should read -- or greater, with an oxygen --

Signed and Sealed this

Twenty-fifth Day of November, 2008

JON W. DUDAS
*Director of the United States Patent and Trademark Office*